United States Patent
Lee et al.

(10) Patent No.: US 9,786,351 B2
(45) Date of Patent: Oct. 10, 2017

(54) SEMICONDUCTOR MEMORY DEVICE FOR PERFORMING REFRESH OPERATION AND OPERATING METHOD THEROF

(71) Applicant: SK hynix Inc., Gyeonggi-do (KR)

(72) Inventors: Sung-Yub Lee, Gyeonggi-do (KR);
Geun-Il Lee, Gyeonggi-do (KR);
Jae-Hoon Cha, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/175,925

(22) Filed: Jun. 7, 2016

(65) Prior Publication Data
US 2017/0186480 A1   Jun. 29, 2017

(30) Foreign Application Priority Data

Dec. 29, 2015   (KR) .................. 10-2015-0188624

(51) Int. Cl.
*G11C 7/00* (2006.01)
*G11C 11/406* (2006.01)
*G11C 11/408* (2006.01)

(52) U.S. Cl.
CPC .... *G11C 11/40615* (2013.01); *G11C 11/4085* (2013.01); *G11C 11/406* (2013.01)

(58) Field of Classification Search
CPC ............ G11C 11/406; G11C 11/40615; G11C 2211/4061
USPC ............................... 365/222, 230.01, 230.06
See application file for complete search history.

(56) References Cited

U.S. PATENT DOCUMENTS

| | | | |
|---|---|---|---|
| 2005/0013185 A1* | 1/2005 | Kim ................ | G11C 11/406 365/222 |
| 2016/0163372 A1* | 6/2016 | Lee ................. | G11C 11/406 365/222 |
| 2016/0329089 A1* | 11/2016 | Lim ................. | G11C 11/406 |

FOREIGN PATENT DOCUMENTS

KR   1020160132243   11/2016

* cited by examiner

*Primary Examiner* — Connie Yoha
(74) *Attorney, Agent, or Firm* — IP & T Group LLP

(57) ABSTRACT

A semiconductor memory device may include: a memory bank comprising a plurality of word lines; a smart command generation unit suitable for generating a smart refresh command, which is enabled at a random cycle, in response to an active command; and a refresh operation control unit suitable for performing a refresh operation to at least one of adjacent word lines of a target word line among the plurality of word lines in response to the smart refresh command.

14 Claims, 3 Drawing Sheets

SEMICONDUCTOR MEMORY DEVICE FOR PERFORMING REFRESH OPERATION AND OPERATING METHOD THEROF

CROSS-REFERENCE TO RELATED APPLICATIONS

The present application claims priority of Korean Patent Application No. 10-2015-0188624, filed on Dec. 29, 2015, which is incorporated herein by reference in its entirety.

BACKGROUND

1. Field

Exemplary embodiments of the present invention relate to a semiconductor design technology and, more particularly, to a semiconductor memory device which performs a refresh operation.

2. Description of the Related Art

A semiconductor memory device includes a plurality of memory banks for storing data, and each of the memory banks includes tens of millions of memory cells. Each of the memory cells includes a cell capacitor and a cell transistor, and the semiconductor memory device stores data through an operation of charging or discharging the cell capacitor. The electric charge stored in the cell capacitor must be ideally constant in the absence of any interruption. However, the electric charge stored in the cell capacitor changes due to a voltage difference from a surrounding circuit. That is, the electric charge may leak in a state where the cell capacitor is charged, or electric charge may be introduced in a state where the cell capacitor is discharged. As substantial change in the electric charge of the cell capacitor due to a leakage current, may result in data stored in the cell capacitor to be changed or lost.

For preventing such a data loss, a semiconductor memory device may perform a refresh operation.

With the development of process technology, integration of semiconductor memory devices has been gradually increasing. Increased integration has led to substantial reductions on the size of a memory bank. However, as the size of a memory bank becomes smaller, the intervals between memory cells and between neighboring word lines also become smaller. Recently, the interval between word lines has become so small that a coupling effect between adjacent word lines may occur causing neighboring memory cells to lose data stored therein.

For preventing such a data loss, existing semiconductor memory devices may refresh all memory cells of the memory bank more frequently. However, too many refresh operations may degrade the overall operation efficiency of the semiconductor memory device. Hence, different solutions are needed.

SUMMARY

Various embodiments are directed to a semiconductor memory device capable of controlling a refresh operation and removing a problem which may occur due to high integration of the semiconductor memory device.

In an embodiment, a semiconductor memory device may include: a memory bank comprising a plurality of word lines; a smart command generation unit suitable for generating a smart refresh command, which is enabled at a random cycle, in response to an active command; and a refresh operation control unit suitable for performing a refresh operation to at least one of adjacent word lines of a target word line among the plurality of word lines in response to the smart refresh command.

The smart command generation unit may include: a counting unit suitable for generating a plurality of counting signals by counting the active command; a decoding unit suitable for generating a plurality of control signals according to the plurality of counting signals; a smart refresh command generation unit suitable for generating the smart refresh command according to a refresh command and the respective control signals; and a smart enable signal generation unit suitable for generating a smart enable signal according to the respective control signals and the smart refresh signal.

The smart refresh command generation unit may generate the smart refresh command when the refresh command and the respective control signals are enabled.

The smart enable signal generation unit may include a plurality of transmission elements suitable for outputting the smart refresh command as the smart enable signal according to the respective control signals.

The semiconductor memory device may further include a normal command generation unit suitable for generating a normal refresh command by counting the refresh command, wherein the normal command generation unit deactivates the normal refresh command in response to the smart enable signal.

The refresh operation control unit may include: a normal address generation unit suitable for generating a normal refresh address by counting the normal refresh command; a target row information generation unit suitable for generating target row information representing the target word line based on a bank address, a row command, and a row address; a smart address generation unit suitable for generating one or more adjacent addresses representing at least one of the adjacent word lines according to the smart refresh command and the target row information; and a word line driving unit suitable for driving word lines corresponding to the normal refresh address and the adjacent addresses.

In an embodiment, a semiconductor memory device may include: a memory bank comprising a plurality of word lines; a smart command generation unit suitable for counting an active command to generate a smart refresh command which is enabled at a random cycle, and generating a smart enable signal when the smart refresh command is enabled; a normal command generation unit suitable for counting a refresh command to generate a normal refresh command which is sequentially enabled, and deactivating the normal refresh command in response to the smart enable signal; and a refresh operation control unit suitable for performing a refresh operation on an adjacent word line group of a target word line among the plurality of word lines in response to the smart refresh command.

The smart command generation unit may include: a counting unit suitable for generating a plurality of counting signals by counting the active command; a decoding unit suitable for generating a plurality of control signals according to the plurality of counting signals; a smart refresh command generation unit suitable for generating the smart refresh command according to a refresh command and the respective control signals; and a smart enable signal generation unit suitable for generating a smart enable signal according to the respective control signals and the smart refresh signal.

The smart refresh command generation unit may generate the smart refresh command when the refresh command and the respective control signals are enabled.

The smart enable signal generation unit may include a plurality of transmission elements suitable for outputting the smart refresh command as the smart enable signal according to the plurality of control signals.

The refresh operation control unit may include: a normal address generation unit suitable for generating a normal refresh address by counting the normal refresh command; a target row information generation unit suitable for generating target row information representing the target word line based on a bank address, a row command, and a row address; a smart address generation unit suitable for generating one or more adjacent addresses representing at least one of the adjacent word line group according to the smart refresh command and the target row information; and a word line driving unit suitable for driving word lines corresponding to the normal refresh address and the adjacent addresses.

In an embodiment, an operating method of a semiconductor memory device may include: generating a plurality of control signals, which are sequentially enabled, by counting an active command; generating a smart refresh command, which is enabled at a random cycle, according to the plurality of control signals and a refresh command; and detecting a target word line among the plurality of word lines, and performing a smart refresh operation to an adjacent word line group of the target word line in response to the smart refresh command.

The operating method of the semiconductor memory device may further include generating a smart enable signal according to the smart refresh command and the respective control signals.

The operating method of the semiconductor memory device may further include further comprising performing a normal refresh operation to the plurality of word lines in response to a normal refresh command, wherein the normal refresh operation is deactivated according to the smart enable signal.

DETAILED DESCRIPTION

Figure 1:
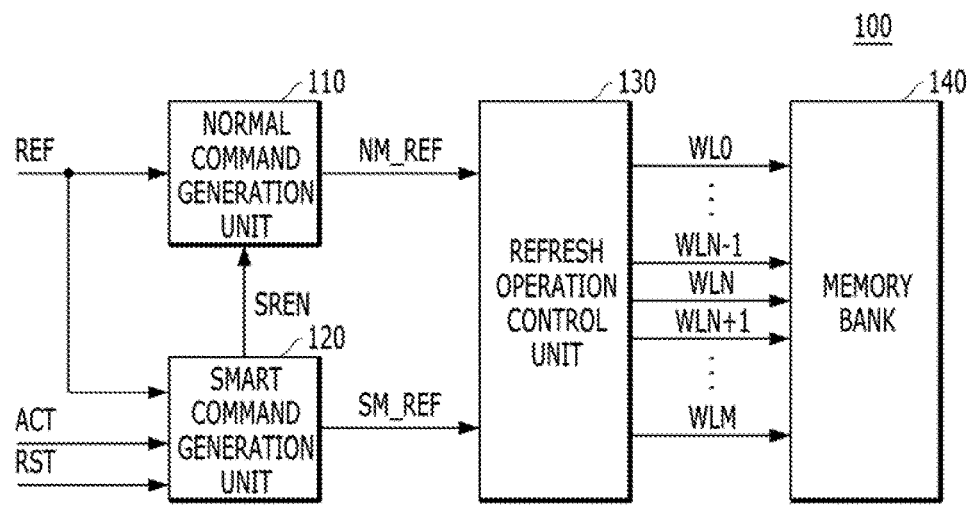
FIG. 1 is a configuration diagram of a semiconductor memory device, according to an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Referring now to FIG. 1 a semiconductor memory device is provided, according to an embodiment of the present invention.

According to the embodiment of FIG. 1, the semiconductor memory device 100 may include a normal command generation unit 110, a smart command generation unit 120, a refresh operation control unit 130, and a memory bank 140.

The normal command generation unit 110 may generate a normal refresh command NM_REF in response to a refresh command REF. The refresh command REF may be enabled during a refresh operation.

The smart command generation unit 120 may generate a smart refresh command SM_REF, which is randomly enabled, in response to an active command ACT and the refresh command REF. The smart command generation unit 120 may generate an internal control signal (not illustrated) by counting and decoding the active command ACT in response to a reset signal RST, and generate the smart refresh command SM_REF by combining the internal control signal and the refresh command REF. The internal control signal may be enabled at a random cycle, not a constant cycle. The smart command generation unit 120 may generate a smart enable signal SREN in response to the smart refresh command SM_REF and the internal control signal. The smart enable signal SREN may be provided to the normal command generation unit 110.

The refresh operation control unit 130 may sequentially access a plurality of word lines WL0 to WLM in response to the normal refresh command NM_REF and the smart refresh command SM_REF.

The refresh operation control unit 130 may perform the refresh operation to the word lines WLN−1 and WLN+1, which is the most adjacent to a target word line WLN, among the plurality of word lines WL0 to WLM, in response to the smart refresh command SM_REF. The target word line WLN may be determined to have high activation frequency among the plurality of word lines WL0 to WLM. Furthermore, the target word line WLN may change among the plurality of word lines WL0 to WLM during each refresh operation.

The memory bank 140 may include a plurality of memory cells for storing a plurality of data, and the plurality of memory cells may be coupled to the plurality of word lines WL0 to WLM. The refresh operation may be performed to an activated word line among the plurality of word lines WL0 to WLM. The refresh operation may include the normal refresh operation and the smart refresh operation.

The semiconductor memory device may receive the refresh command REF, the active command ACT and the reset signal RST. The normal command generation unit 110 may receive the refresh command REF, and the smart command generation unit 120 may receive the refresh command REF, the active command ACT and the reset signal RST as illustrated in the embodiment of FIG. 1.

The normal command generation unit 110 may generate a normal refresh command NM_REF. The smart command generation unit 120 may generate a smart refresh command SM_REF which is randomly enabled. While the smart refresh command SM_REF is enabled, the smart enable signal SREN is enabled and transmitted to the normal command generation unit 110 which disables the normal refresh command NM_REF in response to the enabled smart enable signal SREN.

For example, a ratio of normal refresh operations to smart refresh operations may be set to 7:1, which means that the semiconductor memory device will perform one smart refresh operation for every seven normal refresh operations. Moreover, a normal refresh operation may be disabled when a smart refresh operation is performed. Hence, per each eight refresh commands REF, seven normal refresh operations and one smart refresh operation may be performed. It is understood that the aforementioned ratio of normal refresh operations to smart refresh operations may be changed. The smart refresh operation may be performed once at a random timing during a cycle of the refresh operations, e.g., the smart refresh operation may be performed once for each eight total refresh operations (seven normal refresh commands and one smart refresh command) in response to eight refresh commands. Hence, in this example wherein the ratio of normal refresh operations to smart refresh operations (hereinafter also referred to as the refresh operations ratio ROR) is set to 7:1, one cycle of refresh operations is eight total refresh operations, i.e., seven normal refresh operations and one smart refresh operation. More generally, when the ROR may be N:1 wherein N is a natural number representing the number of normal refresh operations in a cycle of refresh operations comprising N+1 total refresh operations, N of which are normal refresh operations and one is a smart refresh operation.

When the normal refresh command NM_REF is enabled, the refresh operation control unit 130 may receive the normal refresh command NM_REF, and count the normal refresh command NM_REF to activate the plurality of word lines WL0 to WLM. Hence, all of the word lines in a memory bank 140 may be refreshed through each of the normal refresh operations. For example, during a normal refresh operation, as a result of a normal refresh command NM_REF, the refresh operation control unit 130 may activate the plurality of the word lines WL0 to WLM sequentially, i.e., one after another, for refreshing each one of them.

When the smart refresh command SM_REF is enabled, the refresh operation control unit 130 may count the smart refresh command SM_REF to activate at least one of the adjacent word lines WLN−1 and WLN+1 of the target word line WLN, meaning that only WLN−1 may be activated to be refreshed, or only WLN+1 may be activated to be refreshed, or both the WLN+1 and WLN_1 may be activated to be refreshed.

In an embodiment, when the smart refresh command SM_REF is enabled, only one of the adjacent word lines WLN−1 and WLN+1 of the target word line WLN to be activated and refreshed. For example, only the word line WLN−1 or only the word line WLN+1 may be set as the most adjacent word line to the target word line WLN based on the structure of the semiconductor device. In another embodiment both of the adjacent word lines WLN−1 and WLN+1 of the target word line WLN may be set as the adjacent lines to the target word line WLN to be activated and refreshed.

Figure 2:
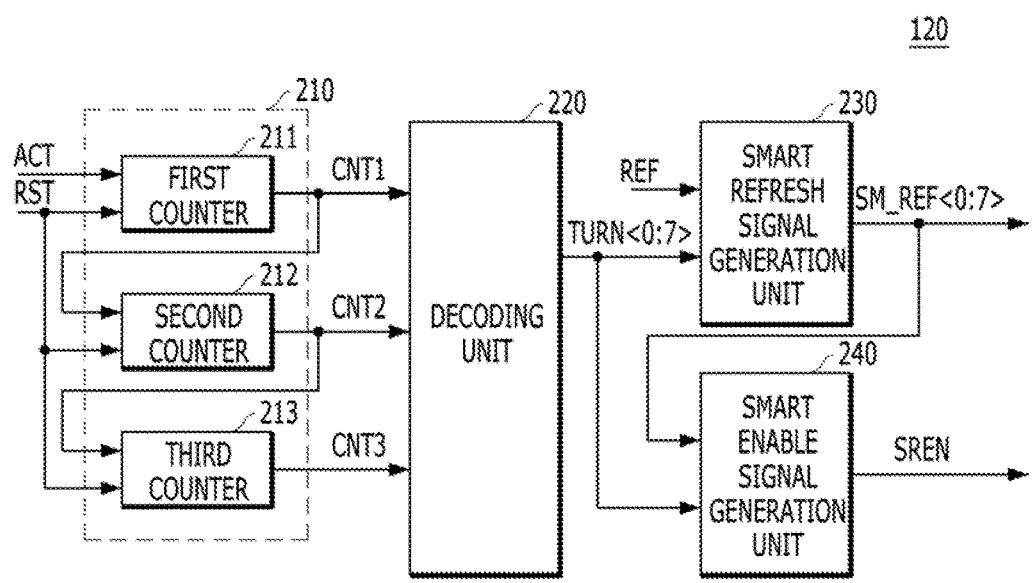
FIG. 2 is a configuration diagram of a smart command generation unit illustrated in FIG. 1, according to an embodiment of the present invention.

Referring now to FIG. 2 an example of a configuration of the smart command generation unit 120 illustrated in FIG. 1 is provided, according to an embodiment of the present invention.

According to the embodiment of FIG. 2, the smart command generation unit 120 may include a counting unit 210, a decoding unit 220, a smart refresh command generation unit 230, and a smart enable signal generation unit 240.

The counting unit 210 may include first to third counters 211 to 213. The first to third counters 211 to 213 may perform a counting operation in response to the reset signal RST and the active command ACT. The first counter 211 may count the active command ACT to output a first counting signal CNT1, the second counter 212 may count the first counting signal CNT1 to output a second counting signal CNT2, and the third counter 213 may count the second counting signal CNT2 to output a third counting signal CNT3. The first counting signal CNT1 is transmitted to the second counter 212 and to the decoding unit 220. The second counting signal CNT2 is transmitted to the third counter 213 and to the decoding unit 220. The third counting signal CNT3 is transmitted to the decoding unit 220.

The decoding unit 220 may generate a plurality of control signals, for example eight control signals TURN<0:7> for the example wherein the cycle of refresh operations includes eight total refresh operations (seven normal refresh operations and one smart refresh operation). The decoding unit 220 may generate the plurality of control signals TURN<0:7> by decoding the first to third counting signals CNT1 to CNT3 provided from the counting unit 210. The plurality of control signals TURN<0:7> may be sequentially enabled.

The smart refresh command generation unit 230 may generate a plurality of smart refresh commands SM_REF<0:7> in response to the refresh command REF and the plurality of control signals TURN<0:7>. The smart refresh command generation unit 230 may generate the plurality of smart refresh commands SM_REF<0:7> each time the refresh command REF and the respective control signals TURN<0:7> are enabled. For example, when the refresh command REF is enabled and the first control signal TURN<0> among the plurality of control signals TURN<0:7> is enabled, the first smart refresh command SM_REF<0> among the plurality of smart refresh commands SM_REF<0:7> may be enabled.

The smart enable signal generation unit 240 may generate the smart enable signal SREN in response to the plurality of control signals TURN<0:7> and the respective smart refresh commands SM_REF<0:7>. In other words, the smart enable signal SREN may be enabled whenever the respective smart refresh commands SR_REF<0:7> are enabled.

The operation of the smart command generation unit will be described below with reference to FIGS. 4 and 5.

Figure 3:
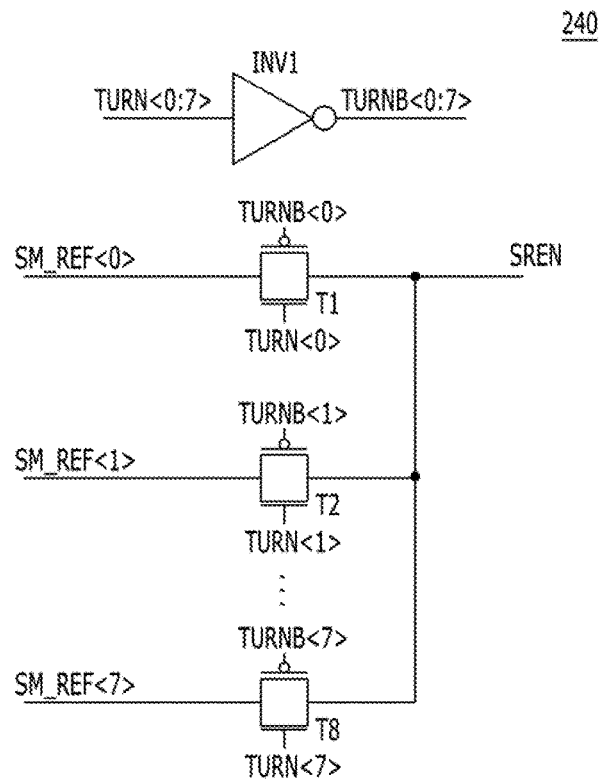
FIG. 3 is a circuit diagram of a smart enable signal generation unit illustrated in FIG. 2, according to an embodiment of the present invention.

FIG. 3 is a circuit diagram of the smart enable signal generation unit 240 illustrated in FIG. 2, according to an embodiment of the invention.

According to the embodiment of FIG. 3, the smart enable signal generation unit 240 may include an inverter INV1 and a plurality of transmission elements T1 to T8. The inverter INV1 may generate a plurality of inverted control signals TURNB<0:7> by inverting the plurality of control signals TURN<0:7>. The plurality of transmission elements T1 to T8 may transmit the plurality of smart refresh commands SM_REF<0:7>, respectively, in order to generate the smart enable signal SREN. That is, when any one of the smart refresh commands SM_REF<0:7> is enabled, the smart enable signal SREN may be enabled.

Figure 4:
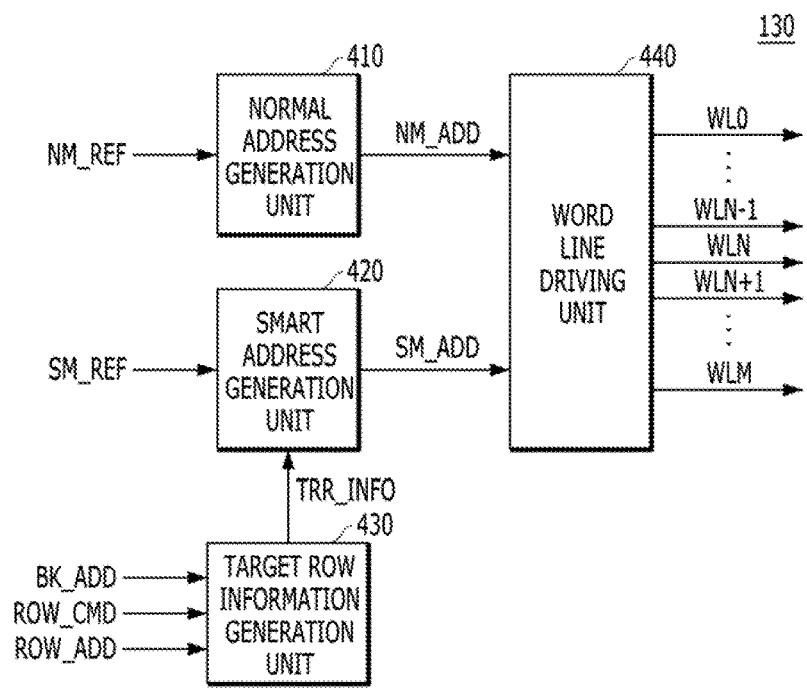
FIG. 4 is a configuration diagram of a refresh operation control unit illustrated in FIG. 1, according to an embodiment of the present invention.

FIG. 4 is a configuration diagram of the refresh operation control unit 130 illustrated in FIG. 1, according to an embodiment of the invention.

According to the embodiment of FIG. 4, the refresh operation control unit 130 may include a normal address generation unit 410, a target row information generation unit 430, a smart address generation unit 420, and a word line driving unit 440.

The normal address generation unit 410 may receive the normal refresh command NM_REF. The normal address generation unit 410 may count the normal refresh command NM_REF and output the normal refresh address NM_ADD to sequentially perform the refresh operation to each one of the plurality of word lines WL0 to WLM.

The target row information generation unit 430 may receive a bank address BK_ADD, a row command ROW_CMD, and a row address ROW_ADD. The target row information generation unit 430 may acquire information on the target word line through the row command ROW_CMD and the row address ROW_ADD. The row address ROW_ADD may represent a word line which is activated during the normal refresh operation.

When the semiconductor memory device enters the active mode, the target row information generation unit 430 may receive the bank address BK_ADD, the row command ROW_CMD, and the row address ROW_ADD at the same time. That is, the target row information generation unit 430 may identify how many times the row address ROW_ADD was activated in the bank corresponding to the bank address BK_ADD, through the row command ROW_CMD and the row address ROW_ADD.

The target row information generation unit 430 may select an address of high activation frequency as one corresponding to the target word line for the smart refresh operation. The target row information generation unit 430 may output the information of the selected address (i.e., the address of high activation frequency) as target row information TRR_INFO to the smart address generation unit 420. For example, the target row information TRR_INFO may represent the target word line WLN.

The smart address generation unit 420 may receive the target row information TRR_INFO from the target row information generation unit 430, and generate a smart refresh address SM_ADD for the smart refresh operation. The smart address generation unit 420 may receive the smart refresh command SM_REF, and output an adjacent address of the target row information TRR_INFO as the smart refresh address SM_ADD. For example, the adjacent address may represent at least one of the adjacent word lines WLN−1 and WLN+1, which is the most adjacent to the target word line WLN represented by the target row information TRR_INFO.

The word line driving unit 440 may receive the normal refresh address NM_ADD from the normal address generation unit 610. The word line driving unit 440 may receive the smart refresh address SM_ADD as the adjacent address from the smart address generation unit 420. The word line driving unit 440 may drive word lines corresponding to the received addresses, respectively.

Figure 5:
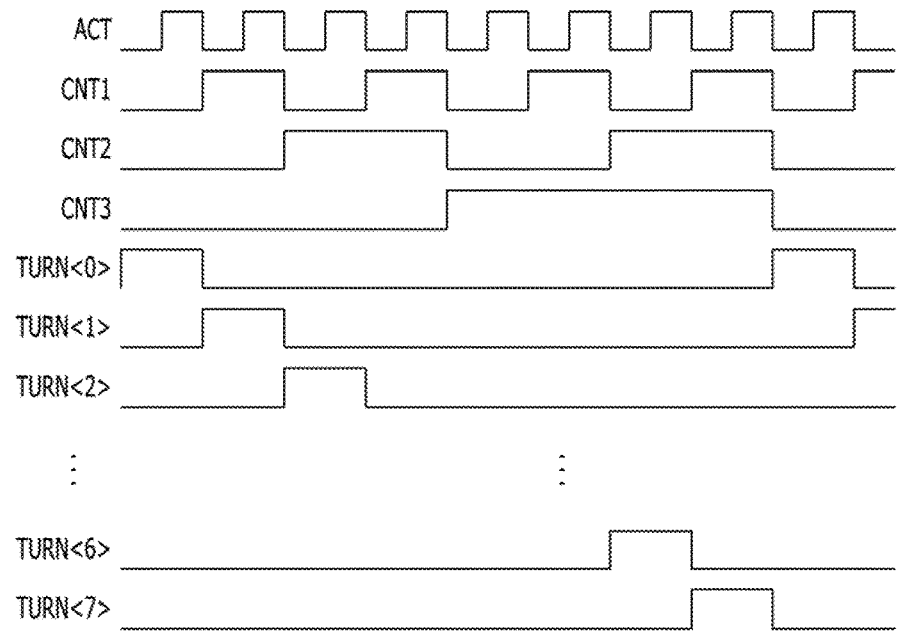
FIG. 5 is a timing diagram illustrating the operations of a counting unit and a decoding unit which are illustrated in FIG. 2, according to an embodiment of the present invention.

FIG. 5 is a timing diagram illustrating the operations of the counting unit 210 and the decoding unit 220 which are illustrated in FIG. 2, according to an embodiment of the invention.

Referring now to FIG. 5, the counting unit 210 may generate the first to third counting signals CNT1 to CNT3 by sequentially counting the active command ACT. Then, the decoding unit 220 may decode the first to third counting signals CNT1 to CNT3, and generate the plurality of control signals TURN<0:7> which are sequentially enabled.

Figure 6:
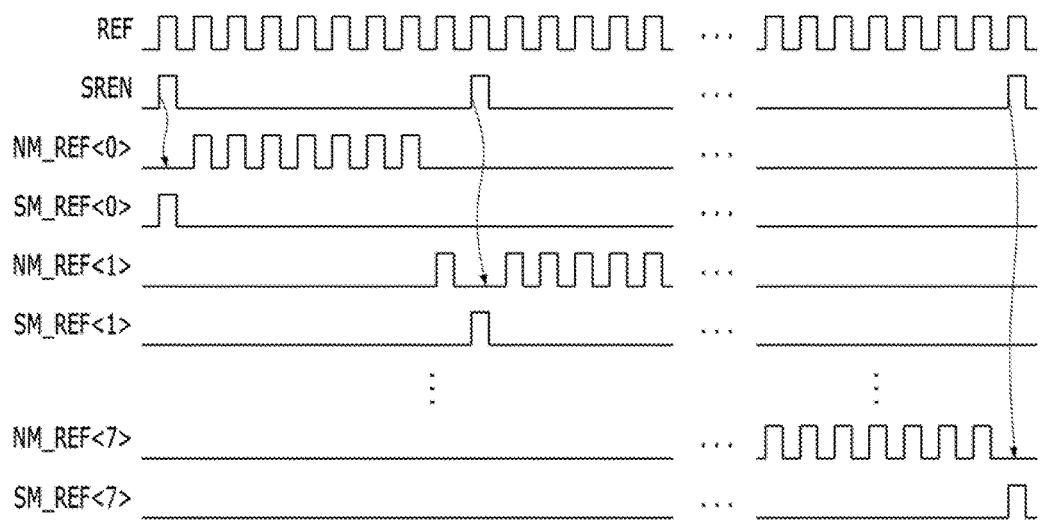
FIG. 6 is a timing diagram illustrating operations of a normal command generation unit and a smart command generation unit which are illustrated in FIG. 1, according to an embodiment of the present invention.

FIG. 6 is a timing diagram illustrating the output operations of the normal command generation unit 110 and the smart command generation unit 120 which are illustrated in FIG. 1.

According to FIG. 6, the normal command generation unit 110 may generate the normal refresh commands NM_REF<0:7> as the refresh command REF is provided. When the smart enable signal SREN is enabled, the normal command generation unit 110 may be deactivated. The smart enable signal SREN may be generated through a combination of the plurality of control signals TURN<0:7> (not illustrated) and the plurality of smart refresh commands SR_REF<0:7>.

The smart command generation unit 120 may generate the plurality of smart refresh commands SM_REF<0:7> through combinations of the refresh command REF and the plurality of control signals TURN<0:7>, such that the plurality of smart refresh commands SM_REF<0:7> are enabled at random timing during the cycle of the refresh operations. For example, when it is assumed that a ratio of normal refresh operations to smart refresh operations to be performed is set to 7:1 per each cycle of the refresh operations, during a first cycle of the refresh operation, the first normal refresh command NM_REF<0> may be enabled seven times in a row to perform seven refresh operations after the first smart refresh command SM_REF<0> is enabled once. Then, during a second cycle of the refresh operations, the second smart refresh command SM_REF<1> may be enabled after the second normal refresh command NM_REF<1> is enabled once, and the second normal refresh command NM_REF<1> may be then enabled six times in a row to perform the remaining refresh operations. As such, the plurality of smart refresh commands SM_REF<0:7> may be enabled at a constant cycle, but enabled at a random cycle.

In short, the semiconductor memory device according to the embodiment of the present invention may control the timing at which the smart refresh operation to the word lines WLN−1 and WLN+1 adjacent to the frequently-accessed target word line WLN is performed, according to a random cycle, not a constant cycle. Thus, the semiconductor memory device may perform the smart refresh operation which is randomized in comparison to the conventional semiconductor memory device. In other words, when commands are provided according to a regular pattern, a malfunction may occur during the smart refresh operation. Thus, as the operation timing of the smart refresh operation is randomized, the smart refresh operation can be performed powerfully even at a regular pattern. Furthermore, as the smart refresh operation is performed, the efficiency of the refresh operation may be increased, and a data loss may be prevented, which makes it possible to guarantee the reliability of the data stored in the memory device.

According to the embodiments of the present invention, the semiconductor memory device can efficiently use a random process, and raise the smart refresh probability, thereby preventing cell deterioration.

It is noted, that in some instances, as would be apparent to those skilled in the relevant art to which the present invention belongs, a feature or element described in connection with one embodiment may be used singly or in combination with other features or elements of another embodiment, unless otherwise specifically indicated.

Although various embodiments have been described for illustrative purposes, it will be apparent to those skilled in the art that various changes and modifications may be made without departing from the spirit and/or scope of the invention as defined in the following claims.

For example, the present invention may be used with any semiconductor memory device including volatile and non-volatile memory devices. Moreover, the semiconductor memory device may be part of a portable or a non-portable electronic device.

What is claimed is:
1. A semiconductor memory device comprising:
a memory bank comprising a plurality of word lines;
a smart command generation block suitable for generating a smart refresh command, which is enabled at a random cycle, in response to an active command; and a refresh operation control block suitable for performing a refresh operation to at least one of adjacent word lines of a target word line among the plurality of word lines in response to the smart refresh command.

2. The semiconductor memory device of claim 1, wherein the smart command generation block comprises:
a counting unit suitable for generating a plurality of counting signals by counting the active command;
a decoding unit suitable for generating a plurality of control signals according to the plurality of counting signals;
a smart refresh command generation unit suitable for generating the smart refresh command according to a refresh command and the respective control signals; and
a smart enable signal generation unit suitable for generating a smart enable signal according to the respective control signals and the smart refresh signal.

3. The semiconductor memory device of claim 2, wherein the smart refresh command generation unit generates the smart refresh command when the refresh command and the respective control signals are enabled.

4. The semiconductor memory device of claim 2, wherein the smart enable signal generation unit comprises a plurality of transmission elements suitable for outputting the smart refresh command as the smart enable signal according to the respective control signals.

5. The semiconductor memory device of claim 2,
further comprising a normal command generation unit suitable for generating a normal refresh command by counting the refresh command,
wherein the normal command generation unit deactivates the normal refresh command in response to the smart enable signal.

6. The semiconductor memory device of claim 5, wherein the refresh operation control block comprises:
a normal address generation unit suitable for generating a normal refresh address by counting the normal refresh command;
a target row information generation unit suitable for generating target row information representing the target word line based on a bank address, a row command, and a row address;
a smart address generation unit suitable for generating one or more adjacent addresses representing at least one of the adjacent word lines according to the smart refresh command and the target row information; and
a word line driving unit suitable for driving word lines corresponding to the normal refresh address and the adjacent addresses.

7. A semiconductor memory device comprising:
a memory bank comprising a plurality of word lines;
a smart command generation block suitable for counting an active command to generate a smart refresh command which is enabled at a random cycle, and generating a smart enable signal when the smart refresh command is enabled;
a normal command generation unit suitable for counting a refresh command to generate a normal refresh command which is sequentially enabled, and deactivating the normal refresh command in response to the smart enable signal; and
a refresh operation control unit suitable for performing a refresh operation on an adjacent word line group of a target word line among the plurality of word lines in response to the smart refresh command.

8. The semiconductor memory device of claim 7, wherein the smart command generation block comprises:
a counting unit suitable for generating a plurality of counting signals by counting the active command;
a decoding unit suitable for generating a plurality of control signals according to the plurality of counting signals;
a smart refresh command generation unit suitable for generating the smart refresh command according to a refresh command and the respective control signals; and
a smart enable signal generation unit suitable for generating a smart enable signal according to the respective control signals and the smart refresh signal.

9. The semiconductor memory device of claim 8, wherein the smart refresh command generation unit generates the smart refresh command when the refresh command and the respective control signals are enabled.

10. The semiconductor memory device of claim 8, wherein the smart enable signal generation unit comprises a plurality of transmission elements suitable for outputting the smart refresh command as the smart enable signal according to the plurality of control signals.

11. The semiconductor memory device of claim 7, wherein the refresh operation control unit comprises:
a normal address generation unit suitable for generating a normal refresh address by counting the normal refresh command;
a target row information generation unit suitable for generating target row information representing the target word line based on a bank address, a row command, and a row address;
a smart address generation unit suitable for generating one or more adjacent addresses representing at least one of the adjacent word line group according to the smart refresh command and the target row information; and
a word line driving unit suitable for driving word lines corresponding to the normal refresh address and the adjacent addresses.

12. An operating method of a semiconductor memory device, comprising:
generating a plurality of control signals, which are sequentially enabled, by counting an active command;
generating a smart refresh command, which is enabled at a random cycle, according to the plurality of control signals and a refresh command; and
detecting a target word line among the plurality of word lines, and performing a smart refresh operation to an adjacent word line group of the target word line in response to the smart refresh command.

13. The operating method of claim 12, further comprising generating a smart enable signal according to the smart refresh command and the respective control signals.

14. The operating method of claim 13,
further comprising performing a normal refresh operation to the plurality of word lines in response to a normal refresh command,
wherein the normal refresh operation is deactivated according to the smart enable signal.

* * * * *